US008852965B2

(12) United States Patent
Fujikane et al.

(10) Patent No.: US 8,852,965 B2
(45) Date of Patent: Oct. 7, 2014

(54) METHOD OF MAKING SEMICONDUCTOR HAVING SUPERHYDROPHILIC PRINCIPAL SURFACE AND METHOD OF ARRANGING PARTICLES THEREON

(71) Applicant: Panasonic Corporation, Osaka (JP)

(72) Inventors: Masaki Fujikane, Osaka (JP); Akira Inoue, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/047,456

(22) Filed: Oct. 7, 2013

(65) Prior Publication Data
US 2014/0034961 A1    Feb. 6, 2014

Related U.S. Application Data

(63) Continuation of application No. PCT/JP2011/004271, filed on Jul. 28, 2011.

(51) Int. Cl.
H01L 21/00      (2006.01)
C30B 29/40     (2006.01)
H01L 21/02     (2006.01)
H01L 21/306    (2006.01)
C30B 33/00     (2006.01)

(52) U.S. Cl.
CPC .......... *H01L 21/0231* (2013.01); *C30B 29/406* (2013.01); *H01L 21/02052* (2013.01); *H01L 21/306* (2013.01); *C30B 33/00* (2013.01)
USPC ........................................... 438/7

(58) Field of Classification Search
CPC ................................................... H01L 21/0231
USPC ............................................................. 438/7
See application file for complete search history.

(56) References Cited

U.S. PATENT DOCUMENTS

| 2008/0049800 | A1  | 2/2008 | Hasegawa et al. |
| 2008/0182072 | A1  | 7/2008 | Choi et al. |
| 2009/0087546 | A1* | 4/2009 | Ilzumi et al. ............... 427/66 |
| 2012/0135549 | A1* | 5/2012 | Nakayama et al. ........... 438/16 |

FOREIGN PATENT DOCUMENTS

| JP | 61-182280 A | 8/1986 |
| JP | 63-038233 A | 2/1988 |

(Continued)

OTHER PUBLICATIONS

International Search Report for corresponding International Application No. PCT/JP2011/004271 mailed Sep. 13, 2011.

*Primary Examiner* — William D Coleman
(74) *Attorney, Agent, or Firm* — Renner, Otto, Boisselle & Sklar, LLP

(57) ABSTRACT

The terminating layer that covers the top layer of a GaN-based semiconductor having a principal surface which is either a non-polar plane or a semi-polar plane, is removed by performing an organic solvent cleaning process step, and replaced with an organic solvent cleaned layer. Next, by irradiating the semiconductor with an ultraviolet ray, the organic solvent cleaned layer is removed to form a surface-modified layer instead. By performing these process steps, the top layer of the GaN-based semiconductor becomes the surface-modified layer and an electrical polarity is given to the surface of the GaN-based semiconductor. As a result, the hydrophilicity, hydrophobicity and wettability of the GaN-based semiconductor can be controlled.

18 Claims, 10 Drawing Sheets

(56) References Cited

FOREIGN PATENT DOCUMENTS

| JP | 2002-043270 A | 2/2002 |
|---|---|---|
| JP | 2007-145639 A | 6/2007 |
| JP | 2008-183702 | 8/2008 |
| JP | 2009-231696 A | 10/2009 |
| WO | WO 2005/089942 A1 | 9/2005 |
| WO | WO 2005/119862 A1 | 12/2005 |
| WO | WO 2009/014590 A2 | 1/2009 |

* cited by examiner

○ N
⊗ Ga (0001) c PLANE  (10-10) m PLANE  (11-20) a PLANE  (-1012) r PLANE c AXIS  c AXIS  c AXIS  c AXIS

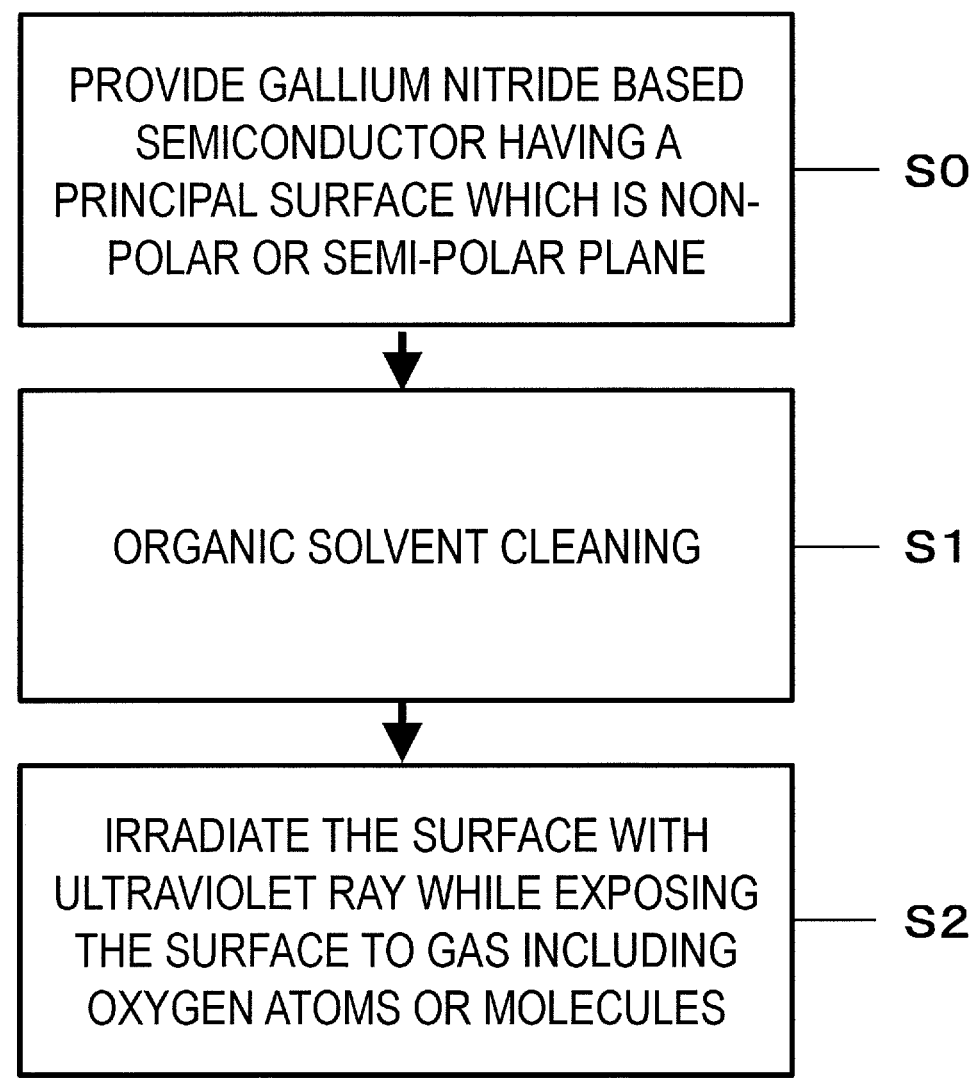

METHOD OF MAKING SEMICONDUCTOR HAVING SUPERHYDROPHILIC PRINCIPAL SURFACE AND METHOD OF ARRANGING PARTICLES THEREON

This is a continuation of International Application No. PCT/JP2011/004271, with an international filing date of Jul. 28, 2011, the contents of which are hereby incorporated by reference.

BACKGROUND

1. Technical Field

The present application relates to a surface-modified semiconductor including a gallium nitride semiconductor, of which the principal surface is either a non-polar plane or a semi-polar plane, and also relates to a method of arranging a plurality of particles on the surface of a semiconductor.

2. Description of the Related Art

Affinity of a liquid for the surface of a solid is called "wettability". To control the wettability is an important process step in a process using a liquid phase. Among other things, in performing a photolithographic process step of a semiconductor device manufacturing process, it is very important to control the hydrophilicity and hydrophobicity of the surface of a semiconductor wafer. That is why there is a growing demand for a technique for controlling hydrophilicity and hydrophobicity at as low a cost and in as short a process time as possible. However, as for a gallium nitride based compound semiconductor (which will be referred to herein as a "GaN-based semiconductor" and which is represented by the general formula: $Al_xGa_yIn_zN$ (where $0 \leq x, y, z \leq 1$ and $x+y+z=1$)), no effective measure has been found yet.

A GaN-based semiconductor has a wurtzite crystal structure. FIG. 1 schematically illustrates a unit cell of GaN. In an $Al_xGa_yIn_zN$ (where $0 \leq x, y, z \leq 1$ and $x+y+z=1$) semiconductor crystal, some of the Ga atoms shown in FIG. 1 may be replaced with Al and/or In atoms.

FIG. 2 shows the primitive vectors $a_1$, $a_2$, $a_3$ and c of a wurtzite crystal structure. The primitive vector c runs in the [0001] direction, which is called a "c-axis". A plane that intersects with the c-axis at right angles is called either a "c-plane" or a "(0001) plane". Furthermore, a plane which is terminated with a Group III element such as Ga is called either a "+c-plane" or a "(0001) plane", whereas a plane which is terminated with a Group V element such as nitrogen is called either a "−c-plane" or a "(000-1) plane". That is to say, these two crystal planes are dealt with as different ones. It should be noted that the "c-axis" and the "c-plane" are sometimes referred to as "c-axis" and "C-plane".

In the present specification, the "m-plane" refers herein to a (10-10) plane that is perpendicular to the [10-10] direction. In the present specification, "−" attached on the left-hand side of a Miller-Bravais index in the parentheses means a "bar" (a negative direction index). As shown in FIG. 2, the m-plane is parallel to the c-axis and intersects with the c plane at right angles. In this case, the "m-plane" is a generic term that collectively refers to a family of planes including (10-10), (−1010), (1-100), (−1100), (01-10) and (0-110) planes.

In the present specification, the "a-plane" refers herein to a (11-20) plane, which intersects with the [11-20] direction at right angles. As shown in FIG. 3C, the a-plane is parallel to the c-axis and intersects with the c-plane at right angles. In this case, the "a-plane" is a generic term that collectively refers to a family of planes including (11-20), (−1-120), (1-210), (−12-10), (−2110) and (2-1-10) planes.

In the present specification, the "+r-plane" refers herein to a (10-12) plane, which intersects with the [10-12] direction at right angles. The r-plane is shown in FIG. 3D. In this case, the "+r-plane" is a generic term that collectively refers to a family of planes including (10-12), (−1012), (1-102), (−1102), (01-12) and (0-112) planes.

In the present specification, the "−r-plane" refers herein to a (10-1-2) plane, which intersects with the [10-1-2] direction at right angles. In this case, the "−r-plane" is a generic term that collectively refers to a family of planes including (10-1-2), (−101-2), (1-10-2), (−110-2), (01-1-2) and (0-11-2) planes.

PCT International Application Publication No. 2009/014590 discloses a technique for subjecting an ink composition having semiconductor nano-crystals including a mixture or alloy of GaN to an ultraviolet ray treatment. The ultraviolet ray treatment disclosed in PCT International Application Publication No. 2009/014590 uses an ultraviolet ray's effect of cross-linking a functional unit by acting on the functional group of a liquid medium which forms part of the ink composition, not on the GaN semiconductor crystals, and therefore, is not a technique for modifying the GaN semiconductor crystals themselves.

Japanese Laid-Open Patent Publication No. 2008-183702 discloses a technique for exposing a pattern forming substrate, including a surface-modified layer having a functional group that has affinity for GaN nano-crystals, to an ultraviolet ray. The ultraviolet ray exposure technique disclosed in Japanese Laid-Open Patent Publication No. 2008-183702 does not act on the GaN crystals but uses the effect of heating in transferring those GaN crystals from a stamper to the surface-modified layer. That is why this is not a technique for modifying GaN crystals themselves, either.

PCT International Application Publication No. 2005/119862 discloses a technique for irradiating a member of a GaN-based semiconductor laser device with an ultraviolet ray. The ultraviolet ray irradiation technique disclosed in PCT International Application Publication No. 2005/119862 does not act on GaN-based semiconductor but is just used to remove Si-containing substances or hydrocarbon from the member of the GaN-based semiconductor laser device. That is why this is not a technique for modifying the GaN-based semiconductor itself, either.

SUMMARY

There is a growing demand for modifying the surface of a semiconductor even more effectively. One non-limiting, and exemplary embodiment provides a technique to modify the surface of a semiconductor more effectively.

In one general aspect, a method of making a surface-modified semiconductor according to the present disclosure includes the steps of: (S0) providing a gallium nitride-based semiconductor having a principal surface which is either a non-polar plane or a semi-polar plane; and (S2) irradiating the principal surface with an ultraviolet ray while the principal surface is exposed to a gas or liquid including oxygen atoms or oxygen molecules. After having gone through the step (S2), the principal surface is superhydrophilic.

According to the above aspect, the principal surface which is either a non-polar plane or a semi-polar plane is exposed to active oxygen and ultraviolet ray, and therefore, organic substances and —OH radicals on the surface can be reduced. In addition, hydrophilicity increases and the surface of a semiconductor can be modified effectively.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 10 is a flowchart showing an exemplary procedure of a method of making a surface-modified semiconductor according to the present disclosure.

DETAILED DESCRIPTION

Figure 1:
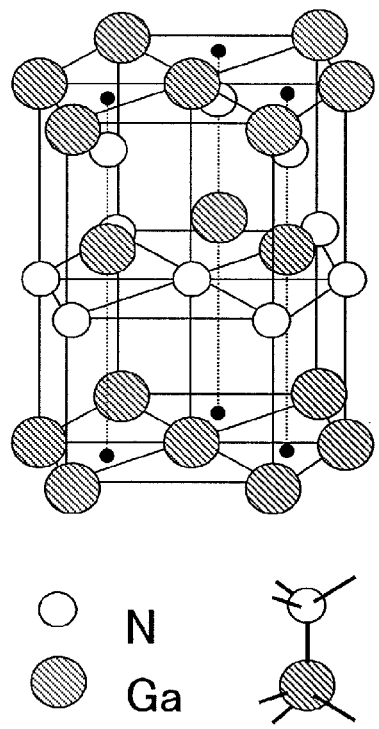
FIG. 1 is a perspective view schematically illustrating a unit cell of GaN.
Figure 2:
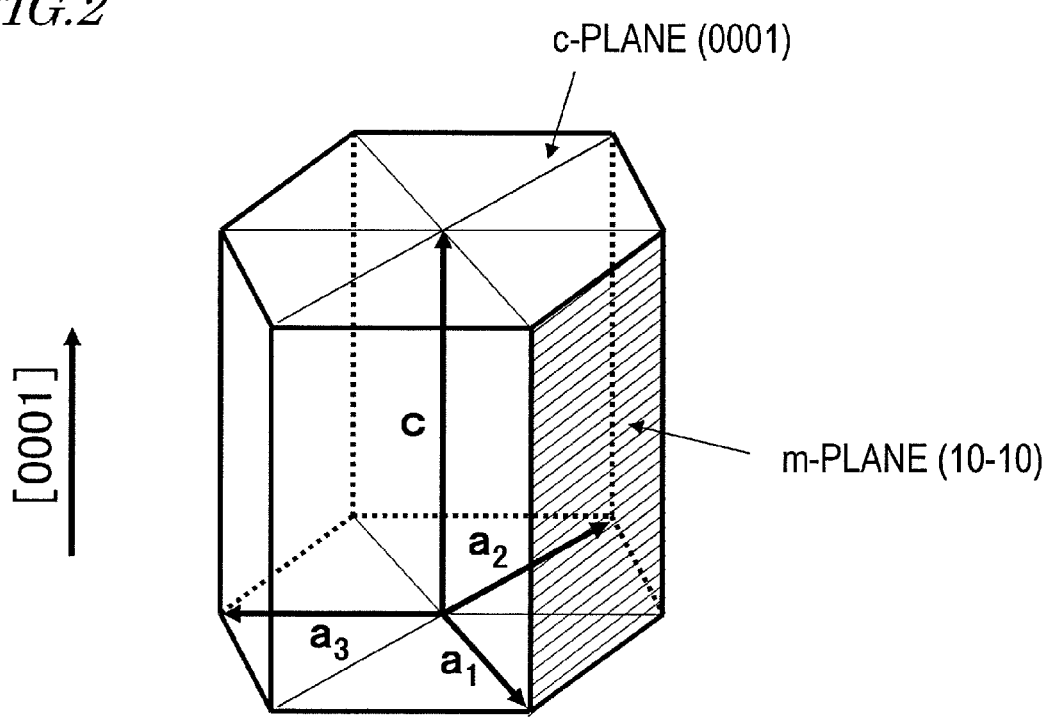
FIG. 2 is a perspective view showing the four primitive translation vectors $a_1$, $a_2$, $a_3$ and c of a wurtzite crystal structure.
Figures 3A, 3B, 3C, 3D:
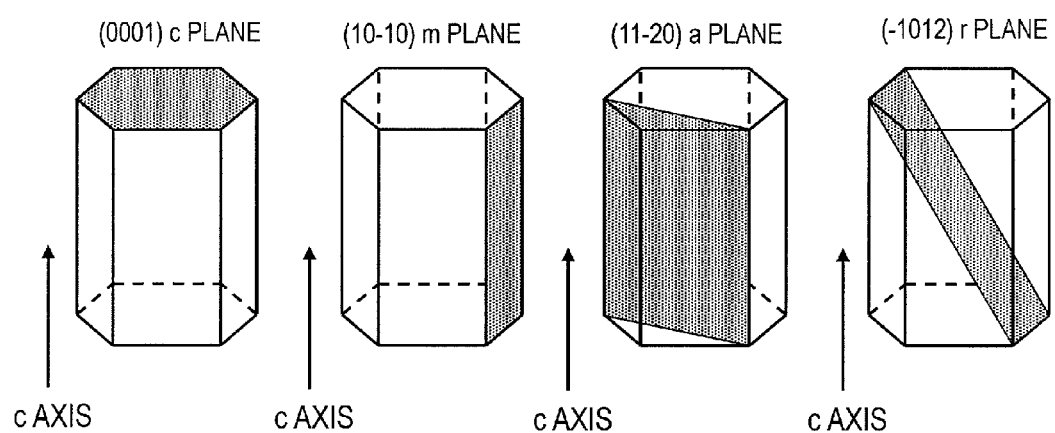
FIGS. 3A to 3D are schematic representations illustrating representative crystalline plane orientations of a hexagonal wurtzite structure.

A method of making a surface-modified semiconductor according to the present disclosure includes the steps of: (S0) providing a gallium nitride-based semiconductor having a principal surface which is either a non-polar plane or a semi-polar plane; and (S2) irradiating the principal surface with an ultraviolet ray while the principal surface is exposed to a gas or liquid including oxygen atoms or oxygen molecules. After having gone through the step (S2), the principal surface is superhydrophilic.

In one embodiment, the method further includes a step (S1) of cleaning the gallium nitride-based semiconductor with an organic solvent before the step (S2).

In one embodiment, the organic solvent is selected from the group consisting of acetone, methanol, ethanol, and isopropyl alcohol.

In one embodiment, the principal surface defines a tilt angle of not less than 18 degrees and no more than 90 degrees with respect to a c-plane.

In one embodiment, the principal surface is one plane selected from the group consisting of m-plane, a-plane, +r-plane and −r-plane.

In one embodiment, the gallium nitride-based semiconductor is a GaN substrate.

In one embodiment, the step (S2) includes the step of exposing the principal surface to an atmosphere including oxygen atoms and irradiating the principal surface with an ultraviolet ray.

In one embodiment, the step (S2) includes the step of exposing the principal surface to an atmosphere including oxygen plasma and irradiating the principal surface with an ultraviolet ray.

In one embodiment, the energy of photons of the ultraviolet ray used in the step (S2) is greater than the bandgap of the principal surface.

In one embodiment, the ultraviolet ray used in the step (S2) is at least one selected from the group consisting of an ultraviolet ray having a wavelength of 352 nm, an ultraviolet ray having a wavelength of 313 nm, an ultraviolet ray having a wavelength of 297 nm, an ultraviolet ray having a wavelength of 254 nm, and an ultraviolet ray having a wavelength of 185 nm.

In one embodiment, a light source that emits the ultraviolet ray used in the step (S2) is a mercury lamp.

In one embodiment, the step (S2) includes the step of irradiating the principal surface with an ultraviolet ray while the gallium nitride-based semiconductor is immersed in pure water.

In one embodiment, the step (S2) includes the step of irradiating the principal surface with an ultraviolet ray while the gallium nitride-based semiconductor is immersed in hydrogen peroxide water.

In one embodiment, after the step (S2) has been performed, no peaks of absorption attributed to —OH radicals are observed on the principal surface by infrared spectroscopy.

In one embodiment, after the step (S2) has been performed, the concentration of carbon as measured on the principal surface by X-ray photoelectron spectroscopy is equal to or smaller than 10 mol %.

A surface-modified semiconductor according to the present disclosure includes: a gallium nitride-based semiconductor having a principal surface which is either a non-polar plane or a semi-polar plane; and a surface-modified layer which has been formed on the principal surface. The surface of the surface-modified layer is superhydrophilic.

In one embodiment, the principal surface defines a tilt angle of not less than 18 degrees and not more than 90 degrees with respect to a c-plane.

In one embodiment, the principal surface is one plane selected from the group consisting of m-plane, a-plane, +r-plane and −r-plane.

In one embodiment, the gallium nitride-based semiconductor is a GaN substrate.

In one embodiment, no peaks of absorption attributed to —OH radicals are observed on the surface-modified layer by infrared spectroscopy.

In one embodiment, the concentration of carbon as measured on the surface-modified layer by X-ray photoelectron spectroscopy is equal to or smaller than 10 mol %.

A particle arranging method according to the present disclosure is a method of arranging a plurality of particles on the surface of a semiconductor. The method includes the steps of: (T1) providing a surface-modified semiconductor including a gallium nitride-based semiconductor having a principal surface which is either a non-polar plane or a semi-polar plane, and a surface-modified layer which has been formed on the principal surface, the surface of the surface-modified layer being superhydrophilic; (T2) immersing the gallium nitride-based semiconductor in a hydrophilic solution containing a plurality of particles; and (T3) pulling the gallium nitride-based semiconductor up from the hydrophilic solution containing the plurality of particles.

In one embodiment, the plurality of particles used in the step (T2) are hydrophilic or the surfaces of particles are subjected to a hydrophilization treatment.

In one embodiment, the plurality of particles used in the step (T2) include at least one selected from the group consisting of $SiO_2$, $TiO_2$, ZnO, Au, Ag, polystyrene, a condensation of benzoguanamine-melamine-formaldehyde, and a cross-link of polymethylmethacrylate.

In one embodiment, the solution used in the step (T2) includes at least one selected from the group consisting of water, methanol, ethanol, phenol, ethylene glycol, and acetic acid.

According to the present disclosure, a GaN-based semiconductor, of which the principal surface is either a non-polar plane or a semi-polar plane, can come to have a surface having a superhydrophilic property. In the present specification, the "surface having a superhydrophilic property" refers herein to a surface on which pure water never coagulates. A GaN-based semiconductor having such a superhydrophilic property has never been realized so far. Such a superhydrophilic property can be realized by applying a technique (discovery) provided by the present disclosure to a GaN-based semiconductor, of which the principal surface is either a non-polar plane or a semi-polar plane. As of now, no technique for making the surface of a c-plane superhydrophilic is known yet.

Hereinafter, embodiments of a surface-modified semiconductor according to the present disclosure will be described with reference to the drawings.

Embodiment 1

In the present specification, a "non-polar plane or a semi-polar plane" includes a crystal plane which defines a tilt angle of not less than 18 degrees and not more than 90 degrees with respect to the c-axis of a nitride semiconductor such as GaN. A "surface-modified semiconductor" according to the present disclosure refers herein to a semiconductor, of which the surface (which may be either a non-polar plane or a semi-polar plane) has been modified at least partially. Such a semiconductor does not have to have a self-standing substrate shape but may also be supported by another substrate or any other structure. Also, in the present specification, the GaN-based semiconductor substrate may be a substrate, of which the surface is partially or entirely formed of a nitride semiconductor represented by the general formula $Al_xGa_yIn_zN$ (where $0 \leq x, y, z \leq 1$ and $x+y+z=1$). That is to say, the GaN-based semiconductor substrate may naturally be a substrate, all of which is formed of a GaN-based semiconductor, but may also be a substrate in which a GaN-based semiconductor layer has been formed on a base member formed of a material other than the GaN-based semiconductor. For instance, examples of the "GaN-based semiconductor substrates" are an a-plane GaN on an r-plane sapphire, an m-plane GaN on an r-plane sapphire, an m-plane GaN on an a-plane sapphire, an m-plane GaN on an m-plane SiC, and other substrates in which GaN has been stacked on a different kind of material.

Hereinafter, an embodiment of a method of making a surface-modified semiconductor according to the present disclosure will be described with reference to FIGS. 4A through 4C and FIG. 10.

First of all, look at FIG. 10. As shown in FIG. 10, a method of making a surface-modified semiconductor according to this embodiment includes the steps of (S0) providing a gallium nitride (GaN) based semiconductor, of which the principal surface is either a non-polar plane or a semi-polar plane, (S1) cleaning the gallium nitride-based semiconductor with an organic solvent, and (S2) irradiating the principal surface with an ultraviolet ray while the principal surface is exposed to a gas or a liquid including oxygen atoms or oxygen molecules. It should be noted that the step (S1) is not an indispensable process step for the present disclosure and could be omitted.

Figure 4A:
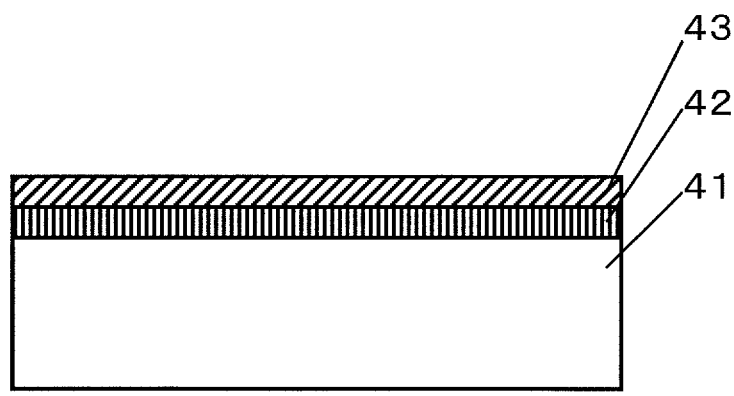
FIG. 4A shows a cross-sectional view of a GaN-based semiconductor having the principal surface of either a non-polar or semi-polar plane according to a first embodiment before a surface modification is performed.

According to this embodiment, first of all, a GaN-based semiconductor, of which the principal surface is either a non-polar plane or a semi-polar plane, is provided as described above. FIG. 4A schematically illustrates a cross section of an example of such a GaN-based semiconductor. The GaN-based semiconductor shown in FIG. 4A is a GaN-based semiconductor 41, of which the surface is a GaN-based semiconductor clean layer 42. The surface of the GaN-based semiconductor clean layer 42 is a crystal plane, of which the principal surface defines a tilt angle with respect to a c-plane. In FIG. 4A, the GaN-based semiconductor clean layer 42 is illustrated as if the layer 42 could be distinguished from the bulk GaN-based semiconductor 41. Actually, however, there is no definite boundary between the GaN-based semiconductor clean layer 42 and the GaN-based semiconductor 41. That is why it is difficult to distinguish the GaN-based semiconductor clean layer 42 from the GaN-based semiconductor 41 by observing a. cross section of theirs. In the present specification, the GaN-based semiconductor clean layer 42 forms part of the GaN-based semiconductor which will turn into a surface-modified layer through a treatment to be performed later.

The GaN-based clean layer 42 is obtained by performing cleaning with a solution of an acid such as hydrofluoric acid, phosphoric acid or sulfuric acid, cleaning with pure water, or a combination thereof. In FIG. 4A, a terminating layer 43 is illustrated schematically on the top of the GaN-based semiconductor clean layer 42. The top of a semiconductor is generally terminated with a layer of impurities deposited on the semiconductor. The terminating layer 43 may be formed of hydrocarbon, a hydroxyl (—OH radical), hydrogen (H) atoms or oxygen (O) atoms, for example. As can be seen, even if the surface of a GaN-based semiconductor is cleaned in an usual manner, the surface of the GaN-based semiconductor exposed to the air should include the GaN-based semiconductor clean layer 42 which is terminated with atoms or molecules other than the atoms that form the GaN-based semiconductor, and therefore, neither Ga atoms nor N atoms are directly exposed on the top.

As will be described later, the present inventors discovered and confirmed via experiments that the state of the top of the surface of a GaN-based semiconductor would change depending on the crystalline plane orientation of that surface.

Figure 4B:
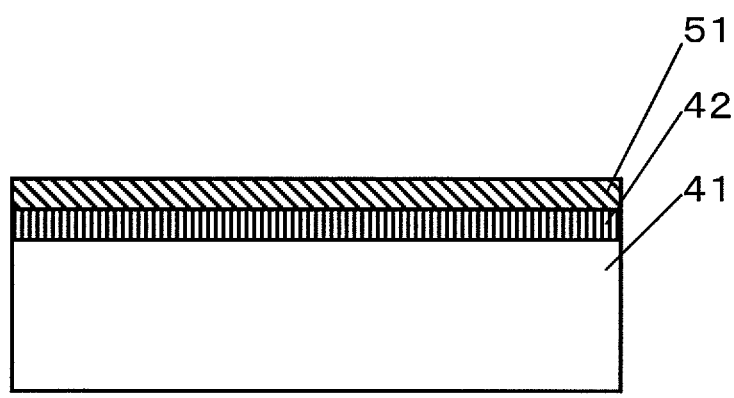
FIG. 4B shows a cross-sectional view of a GaN-based semiconductor having the principal surface of either a non-polar or semi-polar plane according to the first embodiment after organic solvent cleaning has been performed.

Next, this GaN-based semiconductor is cleaned with an organic solvent. FIG. 4B is a cross-sectional view schematically illustrating a state of the GaN-based semiconductor shown in FIG. 4A which has been cleaned with the organic solvent. The terminating layer 43 that formed the top portion in FIG. 4A has been replaced with an organic solvent cleaned layer 51 as a result of the organic solvent cleaning. Actually, however, there is no definite boundary between the organic solvent cleaned layer 51 and the GaN-based semiconductor clean layer 42. That is why it is difficult to distinguish the GaN-based semiconductor clean layer 42 from the organic solvent cleaned layer 51 by observing a cross section of theirs.

The organic solvent cleaned layer 51 is obtained by cleaning using an organic solvent, which includes at least one selected from the group consisting of acetone, methanol, ethanol, and isopropyl alcohol. Optionally, after organic solvent cleaning has been done, the organic solvent cleaned layer 51 may be cleaned with pure water. By cleaning using an organic solvent, the organic substances deposited on the surface of the GaN-based semiconductor can be removed.

Figure 4C:
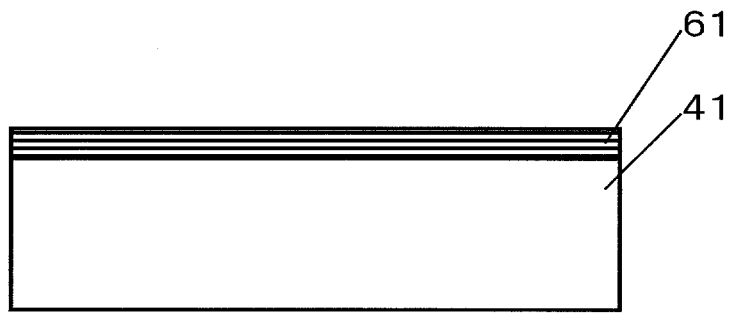
FIG. 4C shows a cross-sectional view of a GaN-based semiconductor having the principal surface of either a non-polar or semi-polar plane according to a first embodiment after the surface modification has been performed.

Next, the GaN-based semiconductor that has been cleaned with the organic solvent is irradiated with an ultraviolet ray. FIG. 4C is a cross-sectional view schematically illustrating the surface state of the GaN-based semiconductor that has been subjected to the ultraviolet ray irradiation process step. According to this embodiment, by being irradiated with the ultraviolet ray, the surface of the GaN-based semiconductor 41 can be turned into a surface-modified layer 61. As will be described later, this surface-modified layer 61 has such a surface state as exhibiting a different property from the terminating layer 43 and the organic solvent cleaned layer 51. By irradiating the GaN-based semiconductor with an ultraviolet ray, most of the organic solvent cleaned layer 51 shown in FIG. 4B has been removed and the GaN-based semiconductor clean layer 42 has turned into the surface-modified layer 61. The surface-modified layer 61 is obtained by removing —OH radicals or at least an impurity layer including —OH radicals from a region near the surface, and may be a layer obtained by oxidizing the surface of the GaN-based semiconductor 41. There is no definite boundary between the surface-modified layer 61 and the GaN-based semiconductor 41. In the present specification, the "surface-modified layer" is made up of the principal surface that is either a non-polar plane or a semi-polar plane and that has been subjected to the surface treatment of the present disclosure and its surrounding region. The "surface-modified layer" is synonymous with the "surface of a crystal" that has been subjected to the surface treatment of the present disclosure, and it is difficult to exactly define the thickness of such a "surface-modified layer". The surface-modified layer may have a thickness of not less than 0.1 nm and not more than 10 nm, for example.

This ultraviolet ray irradiation process step is carried out in either an atmosphere including at least oxygen atoms or a liquid including at least oxygen atoms. For example, the ultraviolet ray may be radiated in the air. Alternatively, the ultraviolet ray may be radiated while oxygen is supplied to the surface of a semiconductor to be modified. Alternatively, the ultraviolet ray may also be radiated in pure water or in hydrogen peroxide water, for example. Still alternatively, the ultraviolet ray may also be radiated while activated oxygen (such as ozone) and/or oxygen radicals is/are supplied onto the surface of the semiconductor. If oxygen radicals need to be supplied onto the surface of the semiconductor, the oxygen radicals may be generated through inductively-coupled oxygen gas discharge, for example. To generate radicals that emit an ultraviolet ray through oxygen gas discharge, either argon or water may be added to the oxygen gas.

The temperature during the ultraviolet ray irradiation process step is not particularly limited. In an example to be described later, the ultraviolet ray was radiated at room temperature without particularly heating or cooling the semiconductor.

If the energy that the photons of an ultraviolet ray to radiate have is greater than the bandgap of the surface of a nitride semiconductor, then the surface of the crystals can be activated and the reaction can be promoted. For example, to modify the surface of GaN, a wavelength of 364 nm or less may be used. Specifically, a mercury lamp may be used as an ultraviolet light source. The surface of GaN may be irradiated with any of ultraviolet rays having wavelengths of 313 nm, 297 nm, 254 nm and 185 nm, which are mercury emission lines. In modifying the surface of InGaN, the surface of InGaN may be irradiated with an ultraviolet ray having a wavelength of 365 nm or 405 nm, which is a mercury emission line. Alternatively, the surface of InGaN may also be irradiated with an ultraviolet ray having a black light wavelength of 352 nm. The ultraviolet ray for use in the ultraviolet ray irradiation process step includes at least one selected from the group consisting of an ultraviolet ray having a wavelength of 352 nm, an ultraviolet ray having a wavelength of 313 nm, an ultraviolet ray having a wavelength of 297 nm, an ultraviolet ray having a wavelength of 254 nm, and an ultraviolet ray having a wavelength of 185 nm. Naturally, the wavelength of the ultraviolet ray to radiate does not always have to be one of these.

The surface-modified layer 61 formed according to this embodiment exhibits a superhydrophilic property. Also, in this surface-modified layer 61, no peaks of absorption attributed to —OH radicals are observed by infrared spectroscopy. The concentration of carbon as measured on the surface-modified layer 61 by X-ray photoelectron spectroscopy was equal to or smaller than 10 mol %.

The surface-modified layer 61 formed according to this embodiment has so high hydrophilicity that a hydrophilic solution can be applied uniformly onto the surface of the surface-modified layer 61. For example, the process step of cleaning using a hydrophilic solution can get done uniformly.

Hereinafter, it will be described how particles may be arranged on the surface-modified layer 61 of a gallium nitride based semiconductor obtained by the method of this embodiment.

As a method of arranging particles on the surface of the surface-modified layer 61, a self-ordering process of a colloidal solution by dip coating may be adopted, for example. Major conditions to be controlled in this process include the kind of the solvent of the colloidal solution, the kind of the solute of the colloidal solution, the concentration of the colloidal solution, and the pulling rate of dip coating. As the solvent, a polar solvent having a large solubility parameter, such as water, methanol, ethanol, phenol, ethylene glycol, or acetic acid, may be used. That is to say, this solvent may be at least one selected from the group consisting of water, methanol, ethanol, phenol, ethylene glycol, and acetic acid. These solvents are hydrophilic and easily available, thus contributing to increasing the mass productivity. Optionally, pure water may also be used as the solvent. On the other hand, as the solute, a spherical hydrophilic solute having a small particle size distribution, such as $SiO_2$, $TiO_2$, ZnO, Au, Ag, polystyrene, a condensation of benzoguanamine-melamine-formaldehyde, or a cross-link of polymethylmethacrylate, may be used. That is to say, a plurality of particles diffused as a solute according to this embodiment in the solvent include at least one selected from the group consisting of $SiO_2$, $TiO_2$, ZnO, Au, Ag, polystyrene, a condensation of benzoguanamine-melamine-formaldehyde, and a cross-link of polymethylmethacrylate. These particles are highly productive and can be mass-produced easily. The colloidal solution may have a concentration of 10 vol % or less. Also, the pulling rate of the dip coating may be 10 cm/h or less. By immersing the GaN-based semiconductor 41 having the surface-modified layer 61 in the colloidal solution and pulling up the semiconductor 41 at a pulling rate falling within that range, the surface-modified layer 61 can get coated with the particles.

Example 1

As Example 1, an m-plane GaN-based surface-modified semiconductor having the configuration shown in FIG. 4C was made. As a comparative example, a c-plane GaN-based semiconductor was made through the same process and had its property compared to that of the m-plane GaN-based surface-modified semiconductor according to Example 1. The results are as follows.

First of all, to obtain the surface-modified semiconductor of Example 1, an untreated m-plane GaN substrate as shown in FIG. 4A and an untreated c-plane GaN substrate (the comparative example) were provided. At this stage, these two kinds of substrates were subjected to an X-ray photoelectron spectroscopy (XPS) measurement and an infrared spectroscopy (IR) measurement.

(1) XPS measurement:
Was carried out within a range of 250 μm×250 μm using a scanning X-ray photoelectron spectroscope PHI Quantera SXM™ (produced by ULVAC, Inc.).

(2) IR measurement:
Was carried out by single reflection ATR method using a Fourier transform infrared spectroscope FT-IR Magna 560 (produced by Nicolet) to which Dura Sampl IR was attached.

Figure 5A:
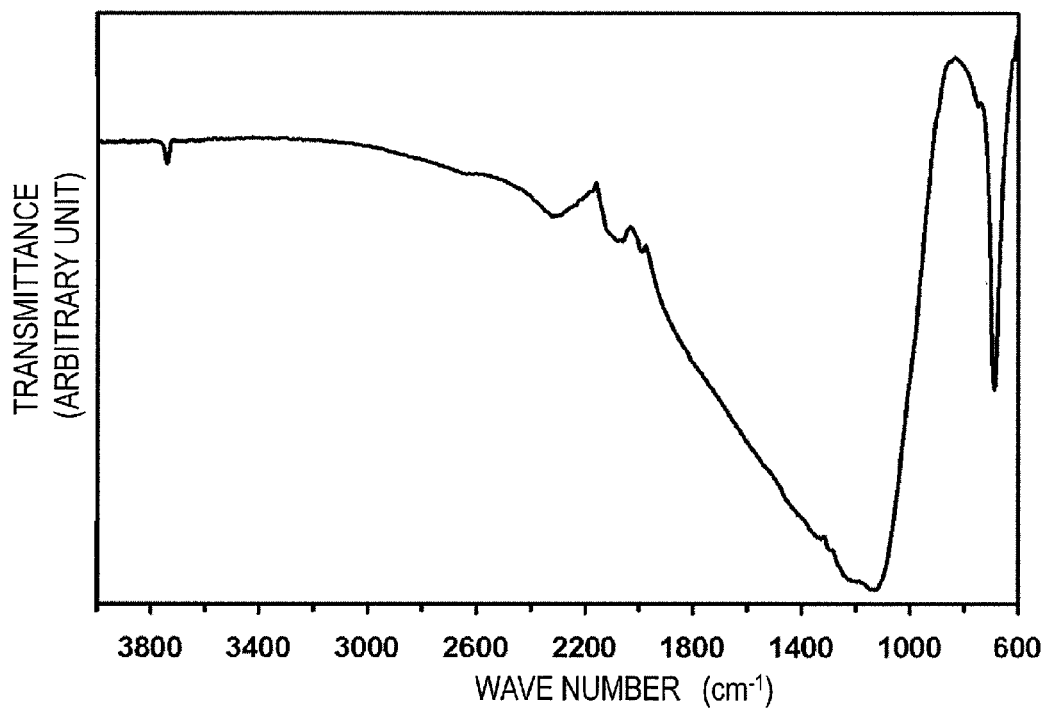
FIG. 5A is a graph showing the results of an IR measurement that was carried out on an untreated m-plane GaN substrate.
Figure 5B:
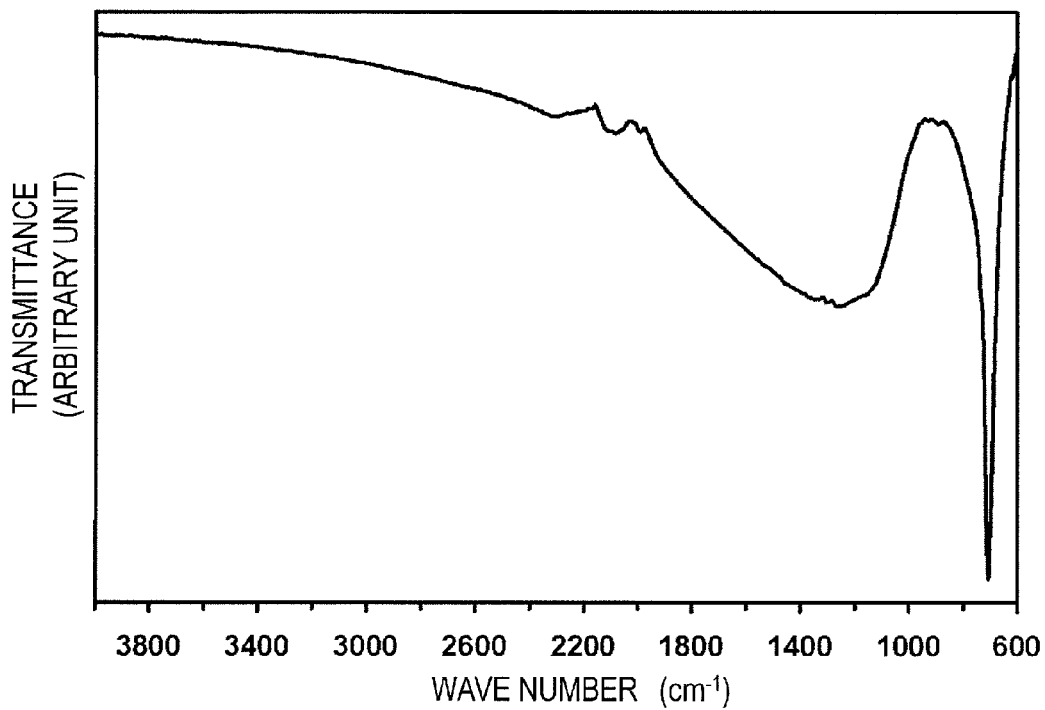
FIG. 5B is a graph showing the results of the IR measurement that was carried out on an untreated c-plane GaN substrate.

FIG. 5A shows the results of the IR measurement that was carried out on the untreated m-plane GaN substrate, and FIG. 5B shows the results of the IR measurement that was carried out on the untreated c-plane GaN substrate.

These two kinds of substrates were ultrasonic cleaned using acetone for three minutes, and then using isopropyl alcohol for three more minutes. Next, these two kinds of substrates were cleaned with pure water for five minutes and then dried with a spin-dry. In this manner, the m-plane GaN substrate (FIG. 4B) and c-plane GaN substrate that had been cleaned with the organic solvent were obtained. For the purpose of comparison, 5 μL of pure water was dripped onto the m-plane GaN substrate at this stage.

Figure 6A:
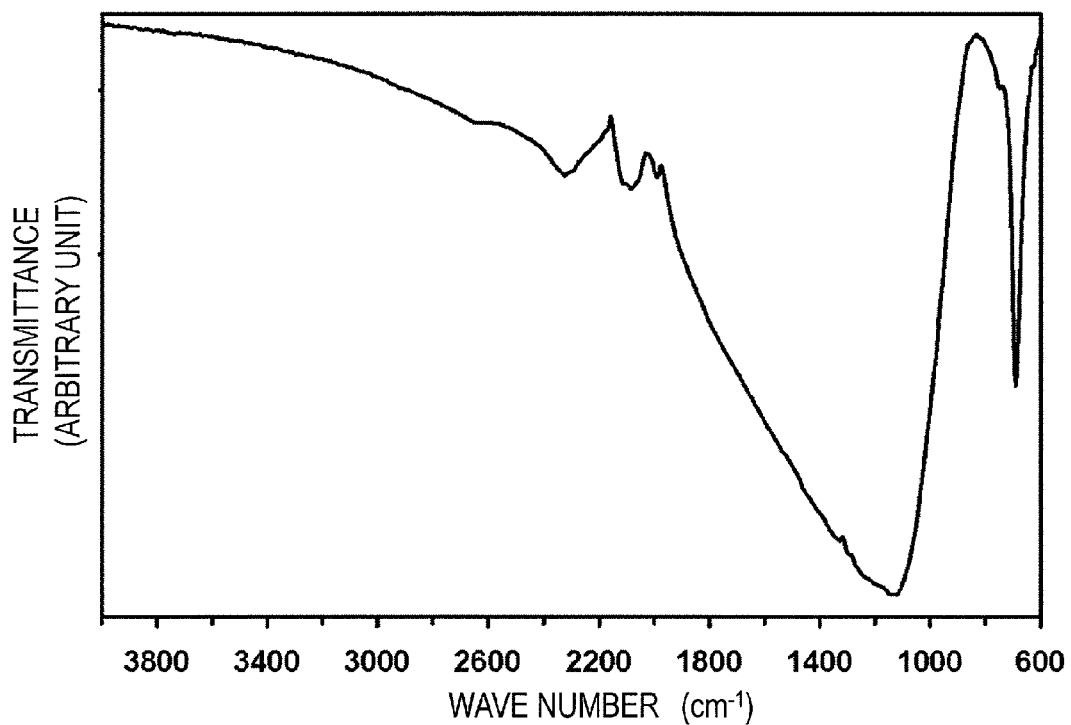
FIG. 6A is a graph showing the results of the IR measurement that was carried out on a surface-modified m-plane GaN substrate.

Subsequently, these two kinds of substrates which had been cleaned with the organic solvent were irradiated in the air with an ultraviolet (UV) ray for 15 minutes. The ultraviolet ray had a wavelength of 254 nm and was radiated at an intensity of 2020 $\mu W/cm^2$ (1818 $mJ/cm^2$). In this manner, the m-plane GaN substrate (FIG. 4C) and c-plane GaN substrate that had been subjected to the surface modifying process step were obtained. At this stage, these two kinds of substrates were subjected to the XPS and IR measurements and 5 μL of pure water was dripped on them. The results of the IR measurement that was carried out on the surface-modified m-plane GaN substrate are shown in FIG. 6A. On the other hand, the results of the IR measurement that was carried out on the surface-modified c-plane GaN substrate are shown in FIG. 6B.

Meanwhile, for the purpose of comparison, the untreated m-plane GaN substrate shown in FIG. 4A was just subjected to the ultraviolet ray irradiation process step without going through the cleaning process step described above, and 5 μL of pure water was dripped on the m-plane GaN substrate thus prepared.

Comparing the results shown in FIGS. 5A and 6A to each other, a peak of absorption due to the dilation of O—H can be observed in the vicinity of 3740 $cm^{-1}$ in FIG. 5A but no such peaks can be observed in FIG. 6A. Thus, it can be seen that by adopting the surface modification processing technique of this embodiment, —OH radicals or an impurity layer including —OH radicals to say the least could be removed from the vicinity of the surface of the untreated m-plane GaN substrate. This is probably because the —OH radicals on the surface of the m-plane GaN substrate would have formed hydroxyl radicals having high oxidation ability by being irradiated with an ultraviolet ray and reacted with impurities such as organic components on the surface of the m-plane GaN substrate to produce an organic acid, and the hydroxyl radicals and organic acid would have been removed from the surface.

Figure 6B:
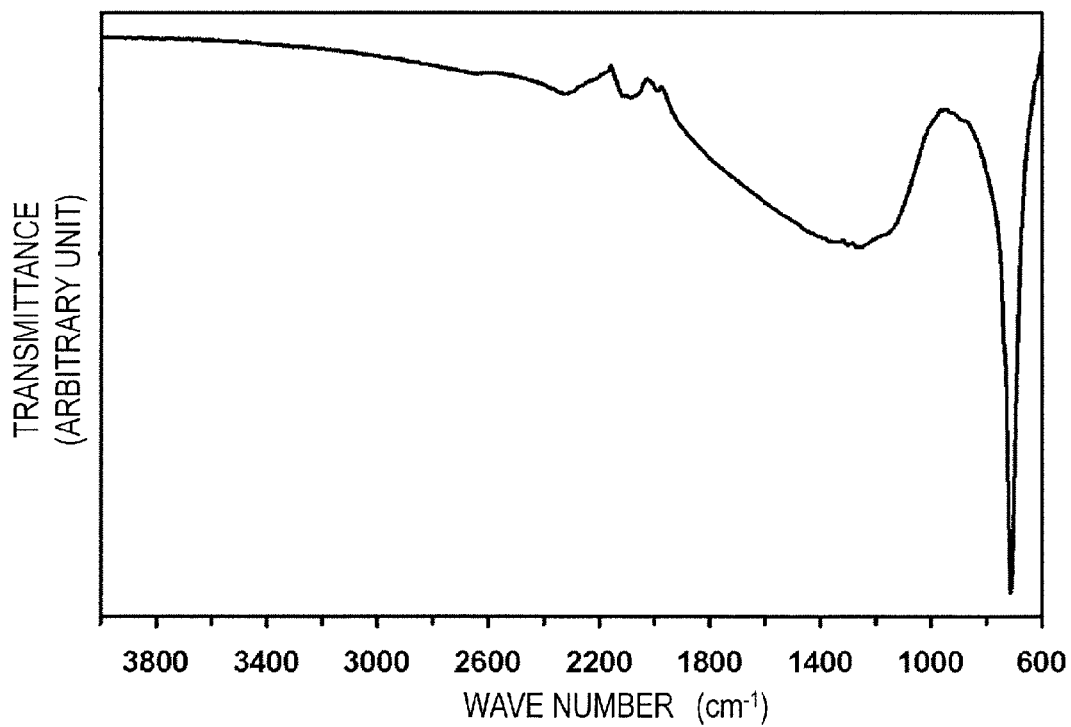
FIG. 6B is a graph showing the results of the IR measurement that was carried out on a surface-modified c-plane GaN substrate.

On the other hand, even if the results shown in FIGS. 5B and 6B are compared to each other, no peak changes can be observed. Thus, it can be seen that the surface of the untreated c-plane GaN substrate has a different atomic structure from the surface of the untreated m-plane GaN substrate and is chemically inactive (i.e., chemically stabilized). For example, even though the surface of +c-plane GaN has one dangling bond exposed on the surface from a gallium atom and the surface of −c-plane GaN has one dangling bond exposed on the surface from a gallium atom, a crystal plane that does not have the c-plane GaN surface (i.e., a non-polar plane or a semi-polar plane) has two or three dangling bonds exposed on the surface. That is why due to such a difference in the atomic structure of the surface, —OH radicals or an impurity layer including at least —OH radicals are not deposited easily on the surface of the untreated c-plane GaN substrate, and therefore, the oxidation treatment by hydroxyl radicals would not advance easily on the surface of the c-plane GaN substrate.

Next, the results of the XPS that was carried out on the untreated m-plane GaN substrate were compared to those of the XPS carried out on the surface-modified m-plane GaN substrate. As a result, even though no significant difference in carbon concentration could be observed on the surface of the c-plane GaN substrate, the effect of decreasing the carbon concentration from 12.4 at % to 4.2 at % could be achieved for the m-plane GaN substrate by the surface modification treatment technique of this embodiment. That is to say, it can be seen that unlike the untreated surface of the m-plane GaN substrate, the untreated surface of the c-plane GaN substrate having a different atomic structure was chemically inactive (i.e., chemically stabilized) and its surface structure did not change easily even if the surface modification treatment technique of this embodiment was adopted. As for the untreated surface of the m-plane GaN substrate, at least an impurity layer including carbon atoms and terminating the surface and —OH radicals would have been removed by adopting the surface modification treatment technique of this embodiment.

Next, 5 μL of pure water was dripped onto an untreated m-plane GaN substrate, a m-plane GaN substrate cleaned with the organic solvent, a surface-modified m-plane GaN substrate, and an m-plane GaN substrate that had gone through only the ultraviolet ray irradiation process step without going through the organic solvent cleaning process step, and the results were compared to each other. As a result, even though the water coagulated on the untreated m-plane GaN substrate, the coagulation decreased after the cleaning process step, and the surface turned superhydrophilic after having gone through the surface modification treatment. However, slight coagulation was observed on the surface that had gone through only the ultraviolet ray irradiation process step without undergoing the cleaning process step. Thus, it can be seen that the surface modification treatment technique of this embodiment is very effective for an m-plane GaN substrate. For that reason, according to the surface modification treatment technique of this embodiment, while carbon atoms and hydroxyl radicals from the terminating layer are removed by irradiating the GaN substrate with an ultraviolet ray, the GaN-based semiconductor clean layer 42 may be oxidized through the oxidation action caused by an ultraviolet ray. Alternatively, after the terminating layer of the GaN substrate has been turned into an organic solvent cleaned layer 51 through organic solvent cleaning, the organic solvent cleaned layer 51 may be irradiated with an ultraviolet ray so as to oxidize the GaN-based semiconductor clean layer 42 through the oxidation action caused by the ultraviolet ray while the organic solvent cleaned layer 51 is removed. The oxidation action will be described later for Comparative Example 1.

On the other hand, comparing an untreated c-plane GaN substrate to a surface-modified c-plane GaN substrate, it can be seen that only minimal effects were achieved even by applying the surface modification treatment technique of this embodiment to the c-plane GaN substrate. Consequently, it can be said that the surface modification treatment technique of this embodiment is different from the conventional technique applied to a c-plane GaN substrate.

The effects achieved by the ultraviolet ray irradiation should include turning —OH radicals on the surface of the m-plane GaN substrate into hydroxyl radicals having high oxidation ability, activating oxygen atoms included in the air and supplying active oxygen atoms onto the m-plane GaN substrate, and increasing the reactivity of the surface of the m-plane GaN substrate by absorbing an ultraviolet ray. The mechanism of this surface modification treatment will be described: in detail later for Comparative Example 1.

Example 2

Although an m-plane GaN-based surface-modified semiconductor has been described as Example 1, an a-plane GaN-based surface-modified semiconductor having the configuration shown in FIG. 4C will be described as Example 2. As already described for Example 1, an untreated a-plane GaN substrate was subjected to a surface modification treatment by going through an organic solvent cleaning process step and an ultraviolet ray irradiation process step. When 5 μL of pure water was dripped onto the untreated a-plane GaN substrate and onto the surface-modified a-plane GaN substrate, it could be seen that the surface had turned superhydrophilic as a result of the surface modification treatment. Consequently, it can be seen that the surface modification treatment technique of this embodiment is effectively applicable to an a-plane GaN-based semiconductor.

Example 3

Although an a-plane GaN-based surface-modified semiconductor has been described as Example 2, a +r-plane GaN-based surface-modified semiconductor having the configuration shown in FIG. 4C will be described as Example 3. As already described for Example 1, an untreated +r-plane GaN substrate was subjected to a surface modification treatment by going through an organic solvent cleaning process step and an ultraviolet ray irradiation process step. When 5 μL of pure water was dripped onto the untreated +r-plane GaN substrate and onto the surface-modified +r-plane GaN substrate, it could be seen that the surface had turned superhydrophilic as a result of the surface modification treatment. Consequently, it can be seen that the surface modification treatment technique of this embodiment is effectively applicable to a +r-plane GaN-based semiconductor.

Example 4

Although a +r-plane GaN-based surface-modified semiconductor has been described as Example 3, a −r-plane GaN-based surface-modified semiconductor having the configuration shown in FIG. 4C will be described as Example 4. As already described for Example 1, an untreated −r-plane GaN substrate was subjected to a surface modification treatment by going through an organic solvent cleaning process step and an ultraviolet ray irradiation process step. When 5 μL of pure water was dripped onto the untreated −r-plane GaN substrate and onto the surface-modified −r-plane GaN substrate, it could be seen that the surface had turned superhydrophilic as a result of the surface modification treatment. Consequently, it can be seen that the surface modification treatment technique of this embodiment is effectively applicable to a −r-plane GaN-based semiconductor.

According to the treatment of this embodiment, the superhydrophilicity would be caused by the atomic structure of the surface of the GaN substrate. The angle defined by the dangling bond on the $sp^3$-orbital is 108 degrees. That is why on a GaN crystal plane which defines a tilt angle of at least 18 degrees, which is obtained by subtracting 90 degrees from this value, with respect to the c-axis, there will be two or more dangling bonds on the surface of the crystal, which can be said to be a different atomic structure from that of c-plane GaN. Consequently, this embodiment would be effectively applicable to a crystal plane which defines a tilt angle of at least 18 degrees with respect to the c-axis of GaN. The surface of m-plane GaN and that surface of a-plane GaN both define a tilt angle of 90 degrees with respect to the c-axis of GaN, and fall within this range. Likewise, the surface of −r-plane GaN and that surface of +r-plane GaN both define a tilt angle of approximately 43 degrees with respect to the t-axis of GaN, and fall within this range, too.

Example 5

Although a surface modification treatment that uses an ultraviolet ray has been described as Example 1, a surface modification treatment that uses oxygen plasma will be described as Example 5. In this Example 5, a surface-modified m-plane GaN-based semiconductor having the configuration shown in FIG. 4C was made, and colloidal crystals of $SiO_2$ nanoparticles having a diameter of 100 nm were arranged on the surface of the surface-modified m-plane GaN-based semiconductor by adopting self-ordering process of a colloidal solution by dip coating to check out the effects of the surface modification. As a comparative example, the self-ordering process of a colloidal solution by dip coating was applied to an untreated m-plane GaN-based semiconductor which had not been subjected to any surface modification treatment to deposit colloidal crystals of $SiO_2$ nanoparticles having a diameter of 100 nm on the untreated surface of the m-plane GaN-based semiconductor, which was then compared to the surface-modified m-plane GaN-based semiconductor of Example 5. The results will be described below.

First of all, to obtain the surface-modified semiconductor of Example 1 shown in FIG. 4C, an untreated m-plane GaN substrate as shown in FIG. 4A was provided. This substrate was ultrasonic cleaned using acetone for three minutes, and then using isopropyl alcohol for three more minutes. Next, the substrate was cleaned with pure water for five minutes and then dried with a spin-dry. In this manner, the m-plane GaN substrate (FIG. 4B) that had been cleaned with the organic solvent was obtained. Subsequently, this substrate was irradiated with oxygen plasma for 30 seconds. The oxygen plasma was generated using a high density plasma etching system NE-500 (produced by ULVAC, Inc.) of the inductively coupled electric discharge type under a processing condition including an antenna power of 500 W, a bias power of 30 W, an oxygen flow rate of 20 sccm, a pressure of 0.6 Pa and a process time of 30 seconds. In this manner, an m-plane GaN substrate that had gone through the surface modification process step (FIG. 4C) was obtained. In the oxygen plasma, oxygen radicals were generated as active oxygen and supplied onto the surface of the m-plane GaN-based semiconductor. In oxygen plasma to be generated by such an inductively coupled electric discharge, excited oxygen radicals having a wavelength of 777 nm form a majority. Also, due to the water contained in the chamber, the surface of the m-plane GaN-based semiconductor is irradiated with an ultraviolet ray having a wavelength of 309 nm that has been produced by hydroxyl radicals. That is to say, the effects achieved would be the same as in a situation where an m-plane GaN substrate is irradiated with an ultraviolet ray in the air.

Colloidal crystals of $SiO_2$ nanoparticles having a diameter of 100 nm were deposited on the surface-modified m-plane GaN substrate and the untreated m-plane GaN substrate by applying the self-arrangement process of a colloidal solution by dip coating to these two kinds of substrates. The colloidal solution was prepared so as to be a 2.0 vol % aqueous solution using spherical silica nanoparticle SEAHOSTAR® KE-P10 (produced by Nippon Shokubai Co., Ltd.). The dip coating was performed at a rate of 2.8 μm/s. The colloidal crystals deposited on the untreated m-plane GaN substrate are shown in FIG. 7A, and the colloidal crystals deposited on the m-plane GaN substrate that was subjected to a surface modification treatment using oxygen plasma are shown in FIG. 7B.

Figure 7A:
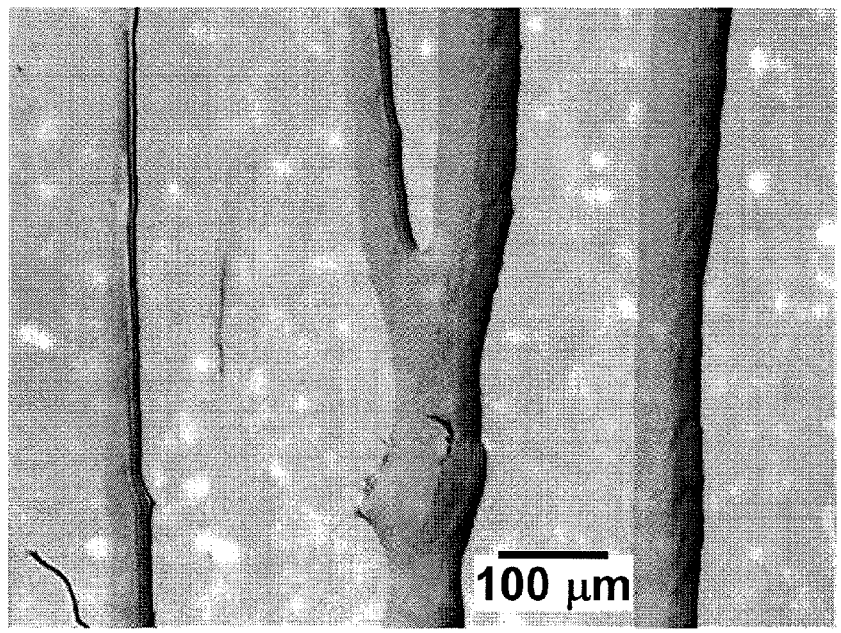
FIG. 7A is a photograph showing colloidal crystals deposited on the untreated m-plane GaN substrate.
Figure 7B:
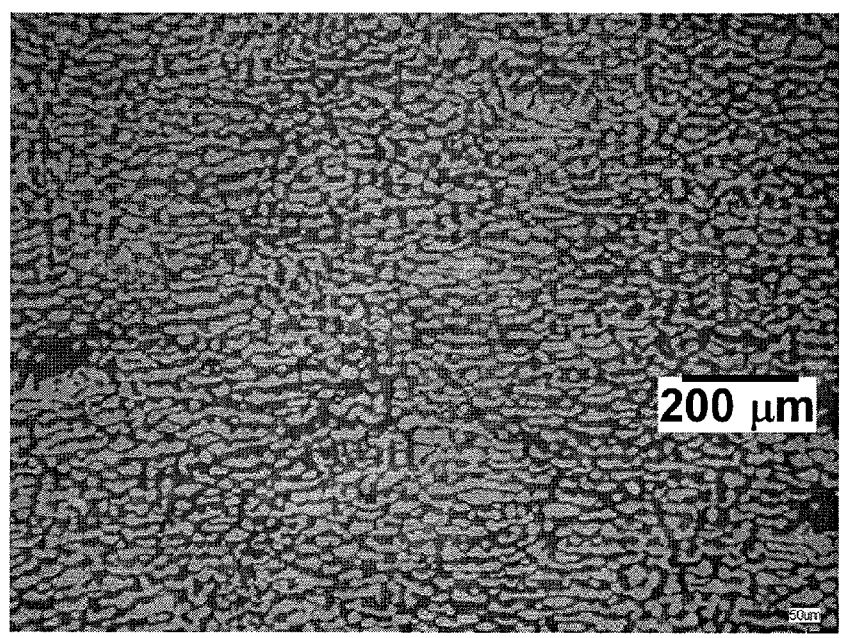
FIG. 7B is a photograph showing colloidal crystals deposited on the m-plane GaN substrate that has been subjected to a surface modification treatment using oxygen plasma.

In FIG. 7A, it can be seen that no nanoparticles were arranged at all, but coagulated, on the surface of the en-plane GaN substrate. On the other hand, in FIG. 7B, the nanoparticles were clearly distributed over the entire surface of the m-plane GaN substrate. Thus, the surface modification effect caused by oxygen plasma can be confirmed.

Example 6

As Example 6, a surface-modified m-plane GaN-based semiconductor having the configuration shown in FIG. 4C was made, and colloidal crystals of $SiO_2$ nanoparticles having a diameter of 100 nm were deposited on the surface of the surface-modified m-plane GaN-based semiconductor by adopting self-ordering process of a colloidal solution by dip coating. In Example 6, a surface-modified m-plane GaN-based semiconductor was made using an ultraviolet ray having a wavelength of 254 nm as in Example 1. On the other hand, as a comparative example, a surface-modified m-plane GaN-based semiconductor was made using an ultraviolet ray having wavelength of 352 nm. And colloidal crystals of nanoparticles were deposited on each of those two kinds of semiconductors. The results will be described below.

To obtain the surface-modified semiconductor of Example 1 shown in FIG. 4C, two untreated m-plane GaN substrates as shown in FIG. 4A were provided. These substrates were ultrasonic cleaned using acetone for three minutes, and then using isopropyl alcohol for three more minutes. Next, the substrates were cleaned with pure water for five minutes and then dried with a spin-dry. In this manner, two m-plane GaN substrates (FIG. 4B) that had been cleaned with the organic solvent were obtained. Subsequently, these substrates were irradiated with ultraviolet rays for 15 minutes. The wavelengths of the ultraviolet rays were set to be 254 nm and 352 nm, respectively, and the two m-plane GaN substrates that had gone through the organic solvent cleaning process step were irradiated with ultraviolet rays having those two different wavelengths. In this manner, m-plane GaN substrates that had gone through the surface modification process step (FIG. 4C) were obtained.

Colloidal crystals of $SiO_2$ nanoparticles having a diameter of 100 nm were deposited on these two surface-modified m-plane GaN substrates by applying the self-arrangement process of a colloidal solution by dip coating to these two kinds of substrates under the same condition as in Example 5. The colloidal crystals deposited on the m-plane GaN substrate that had its surface modified by being irradiated with an ultraviolet ray having a wavelength of 352 nm are shown in FIG. 8A, and the colloidal crystals deposited on the m-plane GaN substrate that had its surface modified by being irradiated with an ultraviolet ray having a wavelength of 254 nm are shown in FIG. 8B.

Figure 8A:
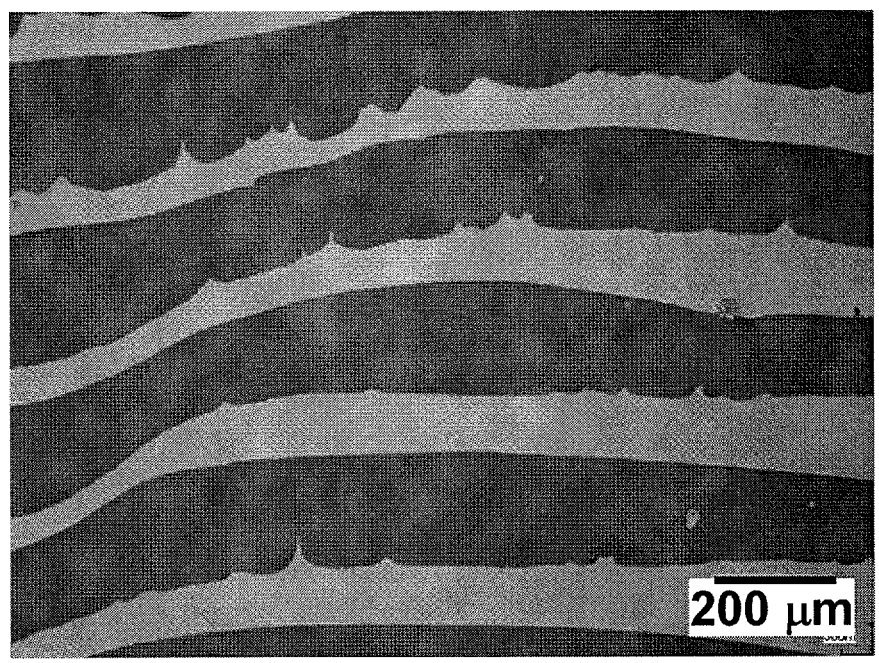
FIG. 8A is a photograph showing colloidal crystals deposited on the m-plane GaN substrate that has been subjected to a surface modification treatment by being irradiated with an ultraviolet ray having a wavelength of 352 nm.
Figure 8B:
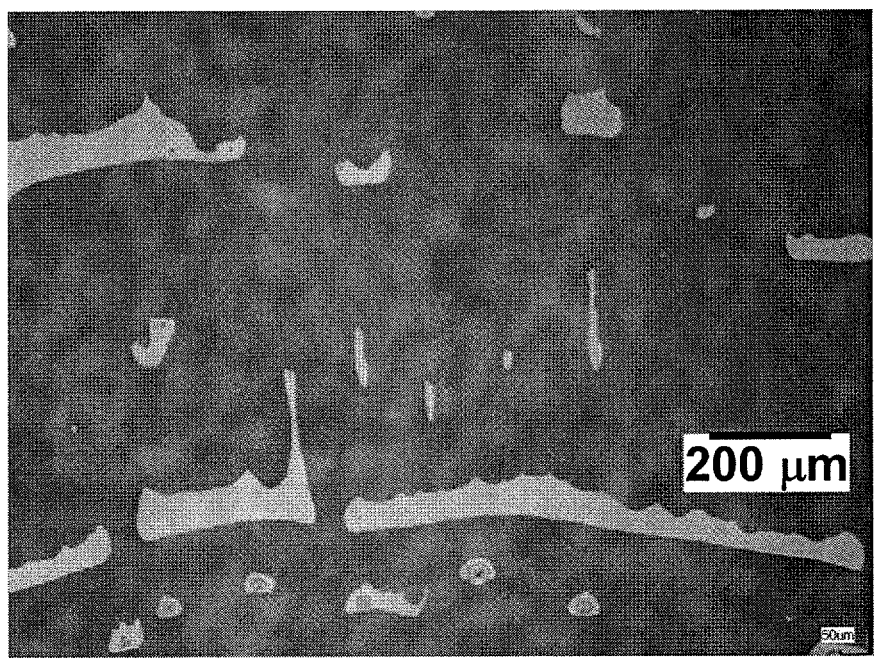
FIG. 8B is a photograph showing colloidal crystals deposited on the m-plane GaN substrate that has been subjected to a surface modification treatment by being irradiated with an ultraviolet ray having a wavelength of 254 nm.

In FIG. 8A, it can be seen that even though the nanoparticles cover the entire surface of the m-plane GaN substrate, regions where those nanoparticles form two layers (i.e., regions in the lighter color in FIG. 8A) alternate with regions where those nanoparticles form a single layer (i.e., regions in the darker color in FIG. 8A). On the other hand, in FIG. 8B, the regions in which the nanoparticles form two layers (i.e., regions in the lighter color in FIG. 8B) clearly decreased and the regions in which the nanoparticles form a single layer (i.e., regions in the darker color in FIG. 8B) increased. Consequently, it can be seen that a higher surface modification effect can be achieved with an ultraviolet ray having the shorter wavelength of 254 nm rather than with an ultraviolet ray having a wavelength of 352 nm.

That is why the same effects would be achieved even if a mercury lamp having an even shorter wavelength of 185 nm is used. Particularly, at a short wavelength of 300 nm or less, hydroxyl radicals having high oxidation ability are generated, and therefore, the surface modification effect would be achieved more significantly.

Generally, according to the advanced oxidation process (AOP), when an ultraviolet ray is radiated, an oxidizing agent such as ozone or hydrogen peroxide water is added. According to this embodiment, however, no oxidizing agent needs to be added intentionally. The reason is that as GaN itself absorbs the ultraviolet ray, more and more organic substances would dissociate themselves on the surface of GaN other than the surface of c-plane GaN. That is why if the energy of the ultraviolet ray is equal to or greater than the bandgap of GaN to be subjected to the surface modification treatment, the effect described above can be achieved. Meanwhile, as there are —OH radicals on the surface of GaN other than the surface of c-plane GaN, those —OH radicals would change into hydroxyl radicals having high oxidation ability by being irradiated with the ultraviolet ray even without adding any oxidizing agent intentionally. Consequently, even with oxygen radicals or ozone obtained by activating oxygen in the air with an ultraviolet ray, the surface modification can get done sufficiently. Furthermore, as the numbers of carbon atoms and —OH radicals decreased on the surface that had been modified, the surface would have been terminated with oxygen. The effect of the oxidation will be described in detail later for Comparative Example 1. Naturally, even if an oxidizing agent is added intentionally, a similar surface modification effect should be achieved, too.

Also, even though a mercury lamp having a wavelength of 185 nm is used according to the advanced oxidation process, it was confirmed that the surface modification effect could be achieved at both of wavelengths of 352 nm and 254 nm. For example, light having a wavelength of 254 nm falls within a range in which ozone is decomposed, but the effect could also be achieved according to this embodiment even at this wavelength. That is why it can be said that the wavelength has only to be equal to or shorter than 362 nm, which is the wavelength of an ultraviolet ray at which GaN itself absorbs light, and it is not always necessary to use light having an extremely short wavelength. However, the effect of this embodiment can be naturally obtained even if light having an significantly short wavelength of 185 nm or less is used.

Example 7

Although the ultraviolet ray was radiated in the air in Example 1 described above, the substrate was immersed in pure water and irradiated with an ultraviolet ray coming from right over the surface of the water in this Example 7. In the other respects, however, this Example 7 is quite the same as Example 1 described above. As a result, a superhydrophilic surface was obtained in the same way as in Example 1.

Example 8

Although the ultraviolet ray was radiated in the air in Example 1 described above, the substrate was immersed in hydrogen peroxide water having a concentration of 30% and irradiated with an ultraviolet ray coming from right over the surface of the liquid in this Example 8. In the other respects, however, this Example 8 is quite the same as Example 1 described above. As a result, a superhydrophilic surface was obtained in the same way as in Example 1.

The following Table 1 summarizes the results of the surface modification described above. In Table 1, the open circle o indicates that a superhydrophilic surface could be obtained and the cross x indicates that no superhydrophilic surface could be obtained:

TABLE 1

|  | Irradiated with UV in the air | Irradiated with UV in $N_2$ atmosphere | Exposed to $O_3$ atmosphere while shielded from UV | Irradiated with UV in $H_2O$ | Irradiated with UV in $H_2O_2$ |
|---|---|---|---|---|---|
| c-plane GaN | x |  |  |  |  |
| m-plane GaN | o | x | x | o | o |
| a-plane GaN | o |  |  |  |  |
| −r-plane GaN | o |  |  |  |  |
| +r-plane GaN | o |  |  |  |  |

Comparative Example 1

Although the ultraviolet ray was radiated in Example 1 described above in the air (i.e., in an atmosphere including about 80 vol % of nitrogen and about 20 vol % of oxygen), the ultraviolet ray was radiated in Comparative Example 1 with the atmosphere controlled. In this Comparative Example 1, the same process steps as those of Example 1 described above are performed through the process step of cleaning the untreated m-plane GaN-based substrate using an organic solvent, but the ultraviolet ray irradiation process step is performed differently after that. Thus, the following description of this comparative example will be focused on that difference.

Two organic solvent cleaned m-plane GaN substrates as shown in FIG. 4B were prepared. One of those two substrates was shielded from the ultraviolet ray radiated so that the m-plane GaN substrate would not be directly irradiated with the ultraviolet ray and was treated for 15 minutes in a shadowed state in which only the atmosphere could circulate. The other substrate was irradiated with the ultraviolet ray for 15 minutes within a 100 vol % nitrogen ($N_2$) atmosphere. In each of these two cases, the ultraviolet ray had a wavelength of 254 nm and was radiated at an intensity of 2020 $\mu W/cm^2$ (1818 $mJ/cm^2$).

The two m-plane GaN substrates were subjected to the surface modification treatment in this manner, and then 5 μL of pure water was dripped on them. When the treatment was carried out in the shadow with the substrate shielded from the ultraviolet ray, the surface modification effect could be achieved but no superhydrophilic surface could be obtained. On the other hand, according to the treatment in which the ultraviolet ray was radiated in $N_2$, the surface modification effect turned out to be minimal.

These results reveal that the surface modification treatment of this embodiment on a GaN surface other than the c-plane GaN surface needs to be carried out in an atmosphere including at least oxygen. That is to say, the mechanism of surface modification with the ultraviolet ray irradiation would work due to the following effects:

(1) An ultraviolet ray, of which the energy is greater than the bandgap energy of a GaN-based semiconductor, is not completely transmitted through, but absorbed into, a GaN-based semiconductor and generates excitons in the GaN-based semiconductor in the meantime, thus increasing the reactivity on the surface of the GaN-based semiconductor. This reactivity would work to dissociate various organic substances and other impurities from the surface of GaN other than a c-plane GaN surface.

(2) The hydroxyl radicals (OH radicals) generated with the ultraviolet ray decompose those organic substances and other impurities to be easily dissociated from the surface of GaN, thus amounts of those organic components and OH components on the surface of the GaN-based semiconductor are decreased.

No surface modification effect could be obtained on the c-plane GaN substrate probably because the surface of the c-plane GaN substrate has a different atomic structure from the surface of the m-plane GaN substrate and is chemically inactive and stabilized. For example, a single dangling bond is exposed on the surface of +c-plane GaN from a gallium atom, and a single dangling bond is exposed on the surface of −c-plane GaN from a gallium atom. According to the results of Example 1, if such a dangling bond on the surface of c-plane GaN is bonded to an organic substance including carbon, the bond would be so strong that it is not easy to remove the organic substance.

Also, according to the results of Example 1, after the surface modification treatment, a much smaller number of bonds on the surface of GaN would be terminated with carbon or —OH radicals. Since the surface of GaN is exposed to active oxygen during the surface modification treatment, the surface that has gone through the surface modification treatment would be terminated with oxygen having two bonds. The reason is that as the surface of a crystal other than a c-plane GaN surface has two or three bonds, oxygen would be easily bonded as a result of the surface modification.

Consequently, it can be seen that if a GaN-based semiconductor is just exposed to an atmosphere having a high ozone concentration and is not irradiated with an ultraviolet ray, the oxidation action on a GaN surface other than a c-plane GaN surface is weak. And it can be seen that in an $N_2$ atmosphere, in particular, even if the GaN-based semiconductor is irradiated with an ultraviolet ray, the oxidation action is very weak.

Also, the surface modification effect was achieved in oxygen plasma in Example 5 described above, probably because the mechanism of surface modification (1) and (2) described above would have worked fine due to the presence of activated oxygen (oxygen radicals) and an ultraviolet ray generated by electric discharge in the oxygen plasma.

For these reasons, the surface modification effect of a non-c-plane GaN surface according to this embodiment would be achieved by irradiating the GaN surface with an ultraviolet ray while the non-c-plane GaN surface is exposed to active oxygen.

Also, considering these results, the effect achieved by cleaning with the organic solvent carried out before the ultraviolet ray irradiation process step would be removing excessive organic components that would interfere with the GaN surface's oxidation from the GaN surface. In Example 1 described above, if the semiconductor has gone through only the ultraviolet ray irradiation process step without undergoing the cleaning process step, coagulation will be generated. If there were such excessive organic components on the GaN surface, the active oxygen would be used to remove those organic components and would not promote the GaN surface's oxidation sufficiently. That is why if there are excessive organic components on the GaN surface, then the surface modification can be advanced by taking some measure such as extending the surface modification treatment time as described for this embodiment, increasing the concentration of the activated oxygen, shortening the wavelength of the ultraviolet ray, or raising the output of the ultraviolet ray, for example.

However, the most effective measure is to perform the organic solvent cleaning process step, which may be performed even if the organic solvent cleaned layer 51 covers the GaN surface either partially or entirely. This is because the organic solvent cleaned layer 51 to be formed on the GaN surface in the organic solvent cleaning process step can be removed effectively through the surface modification mechanism (1) and the oxidation action (2). Since —OH radicals could be reduced from the vicinity of the surface as a result of the surface modification of this embodiment, the organic solvent cleaned layer 51 irradiated with the ultraviolet ray would have reacted with the —OH radicals to form an organic acid and be removed from the surface eventually.

Comparative Example 2

In Comparative Example 2, the effect to be achieved by applying the surface modification technique of this embodiment to a substrate which is not formed of a gallium nitride based compound semiconductor is evaluated. Specifically, in this Comparative Example 2, a c-plane sapphire substrate and a (001) silicon substrate were subjected to the surface modification treatment of Example 1. After that, by applying the self-arrangement process of a colloidal solution by dip coating under the same condition as in Example 5, colloidal crystals of $SiO_2$ nanoparticles having a diameter of 100 nm were deposited on those four substrates, namely, the two untreated substrates and the two surface-modified substrates. The results are as follows.

Figure 9A:
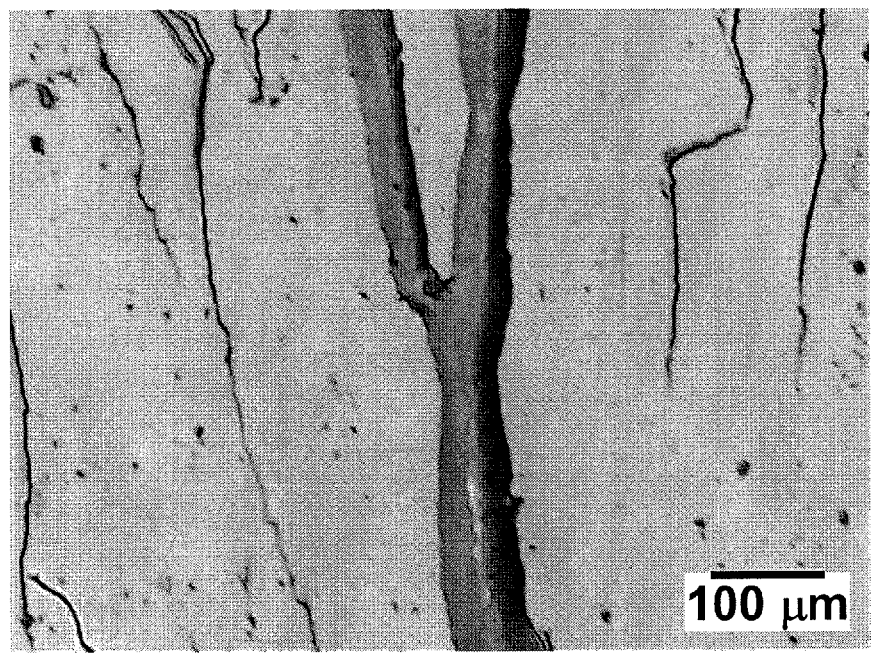
FIG. 9A is a photograph showing the results of deposition of colloidal crystals on an untreated c-plane sapphire substrate.
Figure 9B:
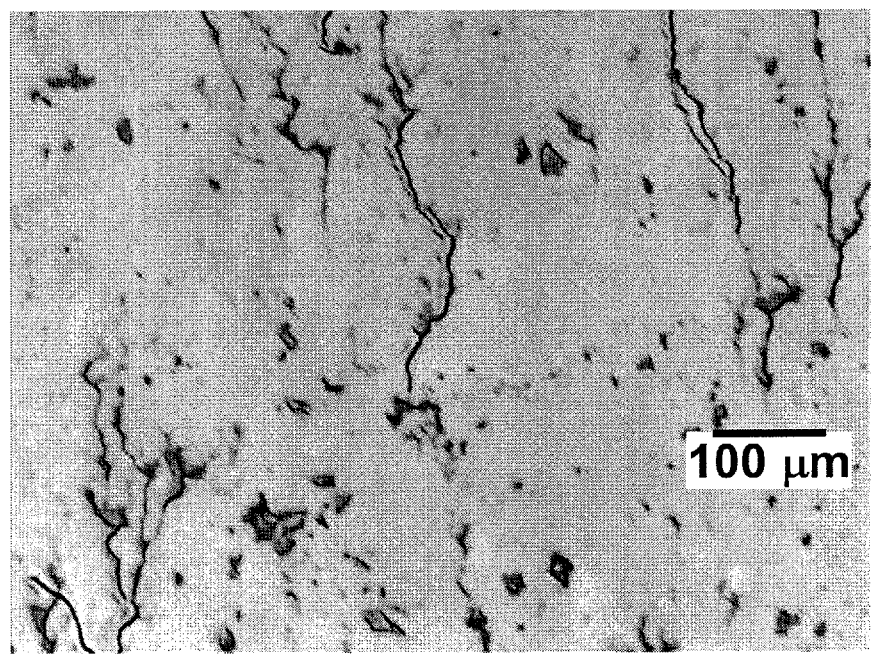
FIG. 9B is a photograph showing the results of deposition of colloidal crystals on a surface-modified c-plane sapphire substrate.
Figure 9C:
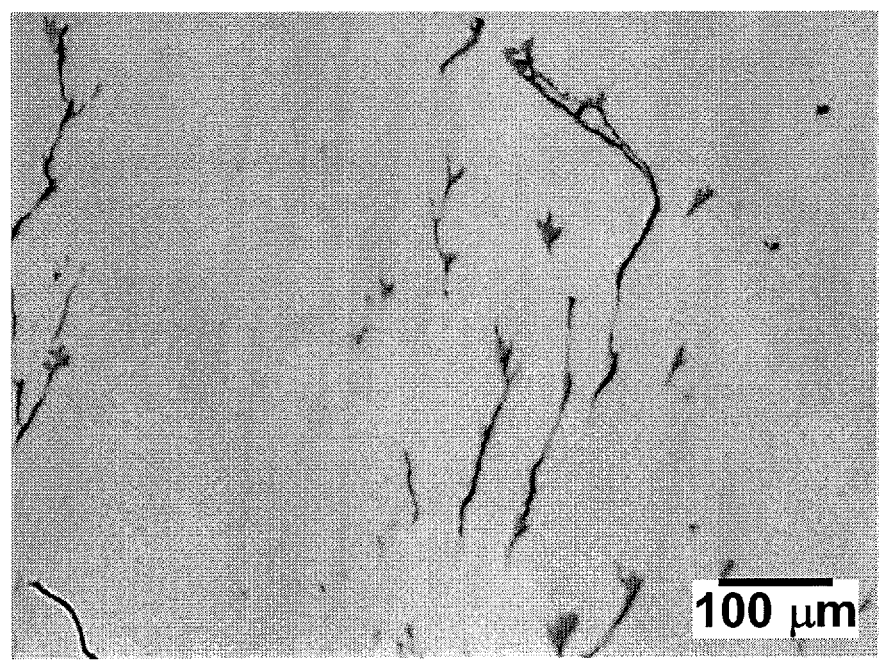
FIG. 9C is a photograph showing the results of deposition of colloidal crystals on an untreated (001) silicon substrate.
Figure 9D:
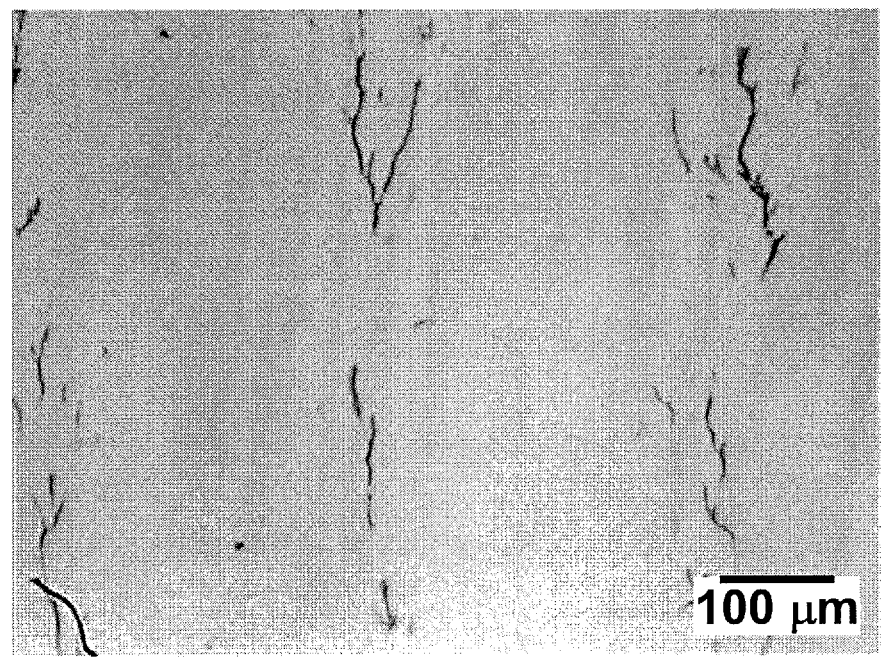
FIG. 9D is a photograph showing the results of deposition of colloidal crystals on a surface-modified (001) silicon substrate.

The results of deposition of colloidal crystals on the untreated c-plane sapphire substrate are shown in FIG. 9A. The results of deposition of colloidal crystals on the surface-modified c-plane sapphire substrate are shown in FIG. 9B. The results of deposition of colloidal crystals on the untreated (001) silicon substrate are shown in FIG. 9C. And the results of deposition of colloidal crystals on the surface-modified (001) silicon substrate are shown in FIG. 9D. Even if the results shown in FIG. 9A, 9B, 9C or 9D are compared to the ones shown in any other one of these drawings, no arrangement of nanoparticles on the surface of the substrate can be observed. Thus, it can be seen that the surface modification technique of this embodiment is not effective for any of these c-plane sapphire and (001) silicon substrates. That is to say, the effects of the surface modification treatment technique of this embodiment can not be observed in any conventional semiconductor substrate such as a sapphire substrate or a silicon substrate but can be observed only on a GaN surface which is a non-polar plane or a semi-polar plane. Consequently, this can be said to be a substrate surface treatment technique which is quite different from the conventional one and which will achieve totally different kinds of effects.

As described above, according to the surface modification treatment technique according to embodiments of the present disclosure, the surface state of a gallium nitride based compound semiconductor (GaN-based semiconductor) having a large area can be modified in a short time and at a reduced cost, and the wettability of a GaN-based semiconductor can be controlled effectively without wasting the time or cost of a semiconductor device manufacturing process.

In the examples described above, a GaN-based semiconductor, of which the principal surface is one plane selected from the group consisting of m, a, +r and −r planes, is supposed to be used. In the present specification, these m, a, +r and −r planes do not exactly have to be m, a, +r and −r planes in the strict sense but may define a tilt angle of ±5 degrees with respect to their associated plane orientation. That is to say, according to the present disclosure, the "m-plane" includes a plane that defines a tilt angle of ±5 degrees or less in a predetermined direction with respect to the m-plane (that is not tilted). Such a plane is tilted overall with respect to the m-plane. However, the plane should actually include a huge number of m-plane regions exposed, speaking microscopically. That is why planes that are tilted at an angle of 5 degrees or less (which is the absolute value) with respect to an m-plane would have similar properties to those of the m-plane. The same can be said about any of the other a, +r and −r planes.

Also, those effects would be achieved in an example of such a GaN-based semiconductor, of which the surface is one selected from the group consisting of m, a, +r and −r planes, not only when the crystal plane of that surface is an m, a, +r or −r plane (or a plane which defines a tilt angle of 5 degrees or less with respect to any of these planes) but also when the surface is any other non-polar or semi-polar plane as well.

It should be noted that the "non-polar or semi-polar plane" may be a crystal plane which defines a tilt angle of 18 degrees or more with respect to a c-plane of GaN, for example.

The surface-modified semiconductor of the present disclosure and a method of making such a semiconductor can be used effectively as a technique for controlling the hydrophilicity and hydrophobicity of the surface of a semiconductor wafer, for example. By adopting this technique, the wettability can be increased in performing a solution treatment process step on a GaN-based semiconductor, of which the principal surface is either a non-polar plane or a semi-polar plane. In addition, according to an embodiment of the present disclosure, the uniformity can be increased in the process step of cleaning using a hydrophilic solution, for example. As a result, the yield of a cleaning process step, for example, can be increased.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A method of making a surface-modified semiconductor comprising the steps of:
   (S0) providing a gallium nitride-based semiconductor having a principal surface which is either a non-polar plane or a semi-polar plane; and
   (S2) irradiating the principal surface with an ultraviolet ray while the principal surface is exposed to a gas or liquid including oxygen atoms or oxygen molecules,
   wherein after having gone through the step (S2), the principal surface is superhydrophilic; and
   after the step (S2) has been performed, no peaks of absorption attributed to —OH radicals are observed on the principal surface by infrared spectroscopy.

2. The method of claim 1, further comprising the step (S1) of washing the gallium nitride-based semiconductor with organic solvent before the step (S2).

3. The method of claim 1, wherein the principal surface defines a tilt angle of not less than 18 degrees and not more than 90 degrees with respect to a c-plane.

4. The method of claim 1, wherein the principal surface is one plane selected from the group consisting of m-plane, a-plane, +r-plane and −r-plane.

5. The method of claim 1, wherein the gallium nitride-based semiconductor is a GaN substrate.

6. The method of claim 1, wherein the step (S2) includes the step of exposing the principal surface to an atmosphere including oxygen atoms and irradiating the principal surface with an ultraviolet ray.

7. The method of claim 1, wherein the step (S2) includes the step of exposing the principal surface to an atmosphere including oxygen plasma and irradiating the principal surface with an ultraviolet ray.

8. The method of claim 1, wherein the energy of photons of the ultraviolet ray used in the step (S2) is greater than the bandgap of the principal surface.

9. The method of claim 1, wherein the ultraviolet ray used in the step (S2) is at least one selected from the group consisting of an ultraviolet ray having a wavelength of 352 nm, an ultraviolet ray having a wavelength of 313 nm, an ultraviolet ray having a wavelength of 297 nm, an ultraviolet ray having a wavelength of 254 nm, and an ultraviolet ray having a wavelength of 185 nm.

10. The method of claim 1, wherein a light source that emits the ultraviolet ray used in the step (S2) is a mercury lamp.

11. The method of claim 1, wherein the step (S2) includes the step of irradiating the principal surface with an ultraviolet ray while the gallium nitride-based semiconductor is immersed in pure water.

12. The method of claim 1, wherein the step (S2) includes the step of irradiating the principal surface with an ultraviolet ray while the gallium nitride-based semiconductor is immersed in hydrogen peroxide water.

13. The method of claim 1, wherein after the step (S2) has been performed, the concentration of carbon as measured on the principal surface by X-ray photoelectron spectroscopy is equal to or smaller than 10 mol %.

14. The method of claim 2, wherein the organic solvent is at least one selected from the group consisting of acetone, methanol, ethanol, and isopropyl alcohol.

15. A method of arranging a plurality of particles on the surface of a semiconductor, the method comprising the steps of:
   (S0) providing a gallium nitride-based semiconductor having a principal surface which is either a non-polar plane or a semi-polar plane; and
   (S2) irradiating the principal surface with an ultraviolet ray while the principal surface is exposed to a gas or liquid including oxygen atoms or oxygen molecules,
   wherein after having gone through the step (S2), the principal surface is superhydrophilic; and
   after the step (S2) has been performed, no peaks of absorption attributed to —OH radicals are observed on the principal surface by infrared spectroscopy;
   (T2) immersing the gallium nitride-based semiconductor in a hydrophilic solution containing a plurality of particles; and
   (T3) pulling the gallium nitride-based semiconductor up from the hydrophilic solution containing the plurality of particles.

16. The method of claim 15, wherein the plurality of particles used in the step (T2) are hydrophilic or the surfaces of particles have been subjected to a hydrophilization treatment.

17. The method of claim 15, wherein the plurality of particles used in the step (T2) include at least one selected from the group consisting of $SiO_2$, $TiO_2$, ZnO, Au, Ag, polystyrene, a condensation of benzoguanamine-melamine-formaldehyde, and a cross-link of polymethylmethacrylate.

18. The method of claim 15, wherein the solution used in the step (T2) includes at least one selected from the group consisting of water, methanol, ethanol, phenol, ethylene glycol, and acetic acid.

* * * * *